US012649863B2

(12) United States Patent
Endo et al.

(10) Patent No.: US 12,649,863 B2
(45) Date of Patent: Jun. 9, 2026

(54) QUANTUM DOT INK COMPOSITION, AND QUANTUM DOT ELECTROLUMINESCENT DEVICE

(71) Applicant: SAMSUNG ELECTRONICS CO., LTD., Suwon-si (KR)

(72) Inventors: Hiroko Endo, Yokohama (JP); Keigo Furuta, Yokohama (JP); Takao Motoyama, Yokohama (JP); Yukika Yamada, Yokohama (JP); Tomoyuki Kikuchi, Kanagawa (JP); Eun Joo Jang, Suwon-si (KR); Hyo Sook Jang, Suwon-si (KR); Jun-Mo Yoo, Suwon-si (KR); Tae Ho Kim, Suwon-si (KR); Yuho Won, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 613 days.

(21) Appl. No.: 18/180,419

(22) Filed: Mar. 8, 2023

(65) Prior Publication Data

US 2023/0287231 A1 Sep. 14, 2023

(30) Foreign Application Priority Data

Mar. 9, 2022 (JP) ................................. 2022-036008
Mar. 8, 2023 (KR) ......................... 10-2023-0030571

(51) Int. Cl.
*C09D 11/50* (2014.01)
*C09D 11/033* (2014.01)
(Continued)

(52) U.S. Cl.
CPC ............ *C09D 11/50* (2013.01); *C09D 11/033* (2013.01); *C09D 11/037* (2013.01);
(Continued)

(58) Field of Classification Search
CPC ........... H10K 50/00–115; C09K 11/00; C09D 11/32; C09D 11/50
See application file for complete search history.

(56) References Cited

U.S. PATENT DOCUMENTS 10,144,066 B2 12/2018 Kumaki et al.
10,734,587 B2 8/2020 Parham et al.
(Continued)

FOREIGN PATENT DOCUMENTS

CN 105820663 A 8/2016
CN 105907180 A 8/2016
(Continued)

OTHER PUBLICATIONS

Japanese Office Action for Japanese Patent Application No. 2022-036008 dated Sep. 2, 2025, with English Translation, (8 pages combined).

*Primary Examiner* — Matthew E. Hoban
(74) *Attorney, Agent, or Firm* — CANTOR COLBURN LLP

(57) ABSTRACT

A quantum dot ink composition including a plurality of quantum dots, and a mixed solvent including a Solvent a and a Solvent b, a quantum dot electroluminescent device including a light emitting layer formed from the quantum dot composition, and a method of making the quantum dot electroluminescent device are provided, where Solvent a is a cycloalkane compound with at least one ring carbon having a linear C4 to C16 alkyl group, an aromatic hydrocarbon compound having a linear C2 to C12 alkyl group, or a combination thereof, and Solvent b is a fluorinated alcohol.

18 Claims, 2 Drawing Sheets

(51) Int. Cl.

| | |
|---|---|
| *C09D 11/037* | (2014.01) |
| *C09D 11/322* | (2014.01) |
| *C09D 11/36* | (2014.01) |
| *C09K 11/02* | (2006.01) |
| *C09K 11/08* | (2006.01) |
| *C09K 11/88* | (2006.01) |
| *H10K 50/115* | (2023.01) |
| *H10K 71/13* | (2023.01) |
| *B82Y 20/00* | (2011.01) |
| *B82Y 40/00* | (2011.01) |

(52) U.S. Cl.

CPC ............ *C09D 11/322* (2013.01); *C09D 11/36* (2013.01); *C09K 11/025* (2013.01); *C09K 11/0883* (2013.01); *C09K 11/883* (2013.01); *H10K 50/115* (2023.02); *H10K 71/135* (2023.02); *B82Y 20/00* (2013.01); *B82Y 40/00* (2013.01)

(56) References Cited

U.S. PATENT DOCUMENTS

| | | | |
|---|---|---|---|
| 10,948,412 B2 | 3/2021 | Nakamura et al. | |
| 11,081,679 B2 | 8/2021 | Tseng et al. | |
| 11,555,149 B2 | 1/2023 | Ippen et al. | |
| 2018/0230321 A1 | 8/2018 | Pan et al. | |
| 2018/0346741 A1 | 12/2018 | Pan et al. | |
| 2019/0002722 A1* | 1/2019 | May | H10K 85/115 |
| 2019/0326533 A1* | 10/2019 | Kim | C09K 11/0805 |

FOREIGN PATENT DOCUMENTS

| | | | |
|---|---|---|---|
| CN | 107400414 A | | 11/2017 |
| CN | 108727903 A | | 11/2018 |
| CN | 109306207 | * | 2/2019 |
| CN | 109306207 A | | 2/2019 |
| CN | 109810572 A | | 5/2019 |
| CN | 111218160 A | | 6/2020 |
| CN | 113122055 A | | 7/2021 |
| JP | 5867842 B2 | | 2/2016 |
| JP | 2017043526 A | | 3/2017 |
| JP | 2020505742 A | | 2/2020 |
| KR | 20160132983 A | | 11/2016 |
| KR | 20180084087 A | | 7/2018 |
| WO | 2019230328 A1 | | 12/2019 |
| WO | 2021050641 A1 | | 3/2021 |

* cited by examiner

QUANTUM DOT INK COMPOSITION, AND QUANTUM DOT ELECTROLUMINESCENT DEVICE

CROSS-REFERENCE TO RELATED APPLICATION

This application claims priority to Japanese Patent Application No. 2022-036008, filed in the Japanese Intellectual Property Office on Mar. 9, 2022, and Korean Patent Application No. 2023-0030571, filed in the Korean Intellectual Property Office on Mar. 8, 2023, and all the benefits accruing therefrom under 35 U.S.C. § 119, the entire contents of which are incorporated herein by reference.

BACKGROUND

1. Field

A quantum dot ink composition, and a quantum dot electroluminescent device are disclosed.

2. Description of the Related Art

In recent years, organic electroluminescent devices (hereinafter also referred to as organic EL devices or OLEDs) have been actively researched and developed as thin-film, light-weight, and low-power consumption display and lighting devices. An organic EL device is a light emitting device having a film including an organic compound, the film having a thickness of several nanometers to several hundred nanometers and disposed between an anode and a cathode. The EL device also includes a plurality of organic materials or layers such as a hole transport layer, a light emitting layer, and an electron transport layer.

Examples of light emitting materials usable for the light emitting layer include a fluorescent light emitting material and/or a phosphorescent light emitting material. Compared to fluorescent light emitting materials, phosphorescent materials are expected to have about 4 times the luminous efficiency, though longer life-span materials, specifically, extended lifetime phosphorescent materials are also demanded for commercial applications of such devices. In addition, an RGB light source requires a sharp emission spectrum to cover a wide color gamut, but it can be very challenging or difficult to obtain light emitting materials that satisfies most if not all of these optical properties or characteristics.

As a method of solving the above technical challenges, the inclusion of quantum dots as a material in a light emitting layer has proven to be quite promising. Because the core of the quantum dot is an inorganic material, the resulting device has been shown to have improved durability and also exhibit a relatively sharp emission spectrum. The development of quantum dots that do not contain toxic elements such as cadmium (Cd) or lead (Pb) is also progressing.

A quantum dot electroluminescent device (hereinafter referred to as a QDLED) using quantum dots as a light emitting layer material may be manufactured by a wet coating method and may provide higher productivity yields than conventional OLEDs. The development of ink compositions including quantum dots that can be used to produce such QDLEDs has been progressing (see Patent References 1 to 4 and Non-Patent Reference 1 as listed below).

(Patent Reference 1) US 2018/0230321A
(Patent Reference 2) JP 2017-043526A
(Patent Reference 3) CN 107400414 B
(Patent Reference 4) CN 105907180 A

SUMMARY

A quantum dot ink composition according to an embodiment includes a plurality of quantum dots, and a mixed solvent including at least a Solvent a and a Solvent b.

Solvent a is a cycloalkane compound with at least a ring carbon having a C4 to C16 linear alkyl group, an aromatic hydrocarbon compound with at least a ring carbon having a C2 to C12 linear alkyl group, or a combination thereof.

Solvent b is a fluorinated alcohol.

According to an embodiment, a quantum dot ink composition having improved dispersion stability, landing properties of quantum dots, and film flatness may be provided.

DETAILED DESCRIPTION

Figure 1:
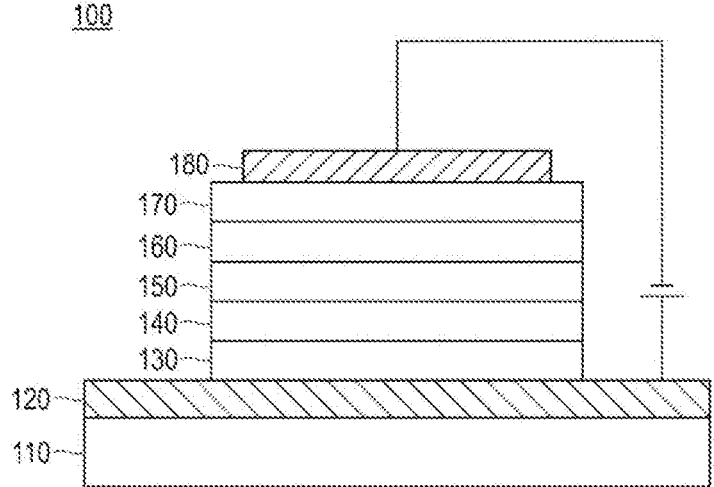
FIG. 1 is a schematic cross-sectional representation showing a quantum dot electroluminescent device according to an embodiment.

The invention now will be described more fully hereinafter with reference to the accompanying drawings, in which various embodiments are shown. This invention may, however, be embodied in many different forms, and should not be construed as limited to the embodiments set forth herein. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least" is not to be construed as limiting "a" or "an." "Or" means "and/or." As used herein, the term "and/or" includes any and all combinations of one or more of the associated listed items. It will be further understood that the terms "comprise" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described. It is to be understood, however, the present disclosure is not limited only to the following described embodiments.

In addition, unless otherwise specified, operation and measurement of physical properties are performed under conditions of room temperature (greater than or equal to about 20° C. and less than or equal to about 25° C.)/relative humidity of greater than or equal to about 40% RH and less than or equal to about 50% RH.

Quantum Dot Ink Composition

A quantum dot-containing layer may be produced by a wet coating process, for example, by using an inkjet process. As a result, it may be important to prevent aggregation of quantum dots in the ink by improving upon the dispersion stability of the ink composition, and thereby to improve light emitting properties in a light emitting layer. In addition, in applying an ink composition including quantum dots with an ink-jet process the technical challenges necessarily includes achieving landing properties of an ink-jet printed ink composition in a precise position and with accurate or uniform amounts of the quantum dots. The flatness of a film prepared from the ink-jet printed ink composition may also be important. However, in the techniques described in Patent References 1 to 4 and Non-Patent Reference 1, at least one of dispersion stability of quantum dots, landing properties of the quantum dot ink composition, or film flatness results in a device that is insufficient in performance.

Therefore, an embodiment provides a quantum dot ink composition having improved dispersion stability, sufficient landing properties of the quantum dot ink composition, and/or good (acceptable) film flatness.

A quantum dot ink composition according to an embodiment includes a plurality of quantum dots and a mixed solvent including a Solvent a and a Solvent b, where Solvent a is a cycloalkane compound with at least a ring carbon having a C4 to C16 linear alkyl group, an aromatic hydrocarbon compound with at least a ring carbon having a C2 to C12 linear alkyl group, or a combination thereof, and Solvent b is a fluorinated alcohol.

The term "fluorinated alcohol" refers to a linear, branched, or cyclic alcohol including a primary, a secondary, or a tertiary alcohol, in which some or all of the hydrogen atoms are substituted with fluorine atoms. For example, a fluorinated alcohol refers to a linear, branched, or cyclic alkyl alcohol, e.g., a primary alcohol, a secondary, or a tertiary alcohol, substituted with at least two or more, four or more, six or more, or eight or more, fluorine atoms.

The mixed solvent provides a quantum dot ink composition of an embodiment with improved dispersion stability and landing properties of the quantum dot ink composition, and in many instances, satisfactory or and accepted film flatness of the ink-jet printed quantum dot ink composition.

The above technical challenges may be addressed by the quantum dot ink composition of an embodiment (hereinafter, simply referred to as "ink composition" or "ink") as follows.

In general, quantum dots have organic ligands such as oleic acid, which can facilitate high dispersion stability in aliphatic hydrocarbon-based solvents, and/or aromatic hydrocarbon-based solvents. However, because such hydrocarbon-based solvents typically have relatively low viscosity and surface tension as the ink is ejected from a nozzle, e.g., a nozzle of an ink-jet element, the ink tends to spread away from the primary target landing, and relatively small amounts of satellite droplets land outside the target or landing position, that is, outside a desired focus area of the main droplets. Accordingly, the inventors in their research have sought select solvents or combinations of solvents with relatively higher surface tension for inkjet ink printing, and thereby, improve upon the landing properties of an ink composition. However, the presence of quantum dots in the ink composition further adds to the challenge because aggregation of the quantum dots in the ink composition may occur, which in turn will lead to a problem of nozzle disfunction, or in general, making it more difficult to eject the ink from the nozzle.

In addition, because the emission color of quantum dots depends on the relative size diameter of the quantum dots, an aggregation of quantum dots following ejection may cause an unwanted change in the desired emission color as well as cause a decrease in quantum yield and/or light emitting properties. Further, while the ink composition including quantum dots may be used to prepare a light emitting layer in a QLED, conventional ink compositions including quantum dots tend to have solvents that are non-repulsive with respect to the materials used for a hole transport layer, and thus, the light emitting layer prepared from the conventional ink composition will more likely conform to the surface shape of the hole transport layer, and consequently, the relative flatness of the light emitting layer may be lowered or be less acceptable.

In regard to the above noted challenges and after diligent research and experiments, the present inventors have found that the above challenges may be solved by a quantum dot ink composition including a plurality of quantum dots and a mixed solvent that includes at least the following two types of solvents:

Solvent a: a cycloalkane compound with at least a ring carbon having a linear C4 to C16 alkyl group, an aromatic hydrocarbon compound with at least a ring carbon having a linear C2 to C12 alkyl group, or a combination thereof, and Solvent b: a fluorinated alcohol.

In general, a surface tension of a liquid may be described as a withdrawing (or pulling) force of a surface of a liquid droplet toward the inside of the droplet due to an aggregation force of the molecules present at the interface between the surface of the droplet and the air. The fluorinated alcohol included in the mixed solvent of the quantum dot ink composition according to an embodiment includes a fluoroalkyl group having a low aggregation force and a hydroxy group (—OH) having a high aggregation force, and therefore, may more readily form a micelle in which the hydroxy groups will tend to aggregate in the micelle. On the other hand, the fluoroalkyl groups of the fluorinated alcohol extend outward and may stably be present on a surface of a droplet of a liquid. Accordingly, the high aggregation force of the hydroxy groups may effectively act as a withdrawing force on the surface of the droplet. Accordingly, the ink composition including the fluorinated alcohol of an embodiment may have a high surface tension, while maintaining good dispersion properties of the quantum dots.

In addition, the ink composition of an embodiment may exhibit a more repulsive characteristic in relation to the material of a hole transport layer. As a result, the ink composition of an embodiment will be less conformal to the surface shape of the hole transport layer, and thus, film flatness (or leveling) of the composition may be improved. Moreover, as it may be advantageous for the fluorinated alcohol to be present near the surface of a liquid droplet, the relative amount of the fluorinated alcohol in the ink may be reduced. As a result, the improved dispersion stability of the quantum dots, the excellent landing properties of the ink, as well as improved film flatness, which could not be obtained with the conventional quantum dot ink composition solvents or solvent systems may be realized or achieved.

Of course, it is to be understood that Applicant's above stated hypothesis as to how the mixed solvent system described may provide the above desired characteristics of the ink composition in no way further limits the subject matter claimed or further limits Applicant's work as described herein. In other words, the above mechanism or stated hypothesis is provided to provide greater technical understanding to those in the relevant art as to why the ink compositions described herein provide improved dispersibility and landing characteristics, and therefore, whether Applicant's hypothesis is shown to be correct or incorrect does not affect the technical scope of the subject matter claimed.

Hereinafter, the configuration of the quantum dot ink composition of an embodiment will be described in detail.

The quantum dots (semiconductor nanoparticles) are semiconductor nanoparticles of a predetermined size that have a quantum confinement effect.

The quantum dots (semiconductor nanoparticles) may be synthesized by a wet chemical process, a metal organic chemical vapor deposition process, a molecular beam epitaxy process, or other similar processes. Among them, the wet chemical process is a method of growing particles by adding a precursor material to an organic solvent. In the wet chemical process, when the crystal grows, the organic solvent is naturally coordinated to the surface of the quantum dot crystal and acts as a dispersant, and thereby, the growth of the crystal can be controlled. In general, a wet chemical process presents less technical challenges and is more cost-efficient than other processes such as vapor deposition methods including metal organic chemical vapor deposition (MOCVD) or molecular beam epitaxy (MBE).

The energy bandgap of quantum dots (semiconductor nanoparticles) may be controlled by adjusting the average particle size, and therefore, light of various wavelengths may be obtained in a light emitting layer (quantum dot light emitting layer). Accordingly, a display that emits light of a plurality of wavelengths may be possible by using a plurality of quantum dots with different average particle size, that is, the average particle size of the quantum dots may be selected to emit red, green, or blue light, which in turn can be used to construct a color display. In addition, quantum dots of different average particle size may be combined in one or more light emitting layers, e.g., stacked light emitting layers of blue, green, and red quantum dot layers to emit white light.

Examples of quantum dots (semiconductor nanoparticles) may include a semiconductor material selected from a Group II-VI semiconductor compound; a Group III-V semiconductor compound; a Group IV-VI semiconductor compound; a Group IV element or compound; and a combination thereof.

The Group II-VI semiconductor compound is not particularly limited, but may include, for example, a binary compound selected from CdSe, CdTe, ZnS, ZnSe, ZnTe, ZnO, HgS, HgSe, HgTe, and a mixture thereof; a ternary compound selected from CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V semiconductor compound is not particularly limited, but may include, for example, a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI semiconductor compound is not particularly limited, but may include, for example, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; and a quaternary compound selected from SnPbSSe, SnPbSeTe, SnPbSTe, and a mixture thereof.

The Group IV element or compound is not particularly limited, but may include, for example, single-element selected from Si, Ge, and a mixture thereof; and a binary compound selected from SiC, SiGe, and a mixture thereof.

The quantum dot may consist of one type of compound or may consist of two or more types of compounds. For example, the quantum dot may have a core-shell structure including a core made of a semiconductor compound and a shell made of a semiconductor compound different from the core. The luminous efficiency of the quantum dot may be increased by using a semiconductor compound for the shell that has a bandgap higher than that of the semiconductor compound forming the core, so excitons are more confined to the core. Examples of core/shell structures (core/shell) having such a relationship of bandgap may include CdSe/ZnS, CdSe/ZnSe, CdSe/CdS, CdTe/CdS, InP/ZnS, CuInS/ZnS, ZnTeSe/ZnSe/ZnS, InP/ZnSe/ZnS, etc.

The quantum dots may not include Cd (cadmium) and Pb (lead) as constituent elements due to their toxicity to the environment.

The particle diameter (size) of the quantum dots may be appropriately adjusted according to the material constituting the quantum dots so as to obtain light of a desired wavelength. As the particle size of quantum dots decreases, the energy bandgap increases. In other words, as the crystal size decreases, the light emission of the quantum dots shifts to the blue, that is, to the high energy. Accordingly, by changing the size of the quantum dots, it is possible to adjust the emission wavelength over the wavelength range of the ultraviolet, visible, and infrared spectrum.

As an example, the average particle diameter (average diameter) of the plurality of quantum dots (semiconductor nanoparticles) is not particularly limited but may be about 1 nanometer (nm) to about 15 nm. In terms of light emitting properties and dispersion stability of quantum dots, the average particle diameter may be about 7 nm to about 15 nm. The average particle diameter of quantum dots can be obtained by measuring the particle diameter of quantum dots by TEM, SEM, XRD, etc., and calculating the volume-based average particle diameter, using methods well known to a person of ordinary skill in the art.

Quantum dots are, in general, prepared having an organic ligand having a group that coordinates to the surface of the quantum dot. By adding an organic ligand to the quantum dot raw material solution during the synthesis of quantum dots, excessive crystal growth may be minimized and quantum dots within a desired particle size range may be obtained. In addition, quantum dots having a surface layer composed of organic ligands on the surface may prevent aggregation during and after the synthesis preparation.

The organic ligand may be an organic compound having a coordinating group that binds to a surface metal cation of the quantum dot. Examples of the coordinating group may include a halogen atom, a carboxy group, a carboxylic anhydride group, an amino group, an ammonium group, a mercapto group, a sulfide group, a sulfoxide group, a phosphine group, a phosphine oxide group, a phosphoric acid group, a phosphonic acid group, a phosphinic acid group, a sulfonic acid group, a boronic acid group, a heterocyclic ring group, and the like. These organic ligands may be used alone or in combination of two or more.

Examples of the halogen atom-containing compound include halogenated alkyl compounds having a linear or branched alkyl group having 1 to 30 carbon atoms. Specific examples of such halogenated alkyl compounds may include, for example, methyl chloride, methyl bromide, methyl iodide, ethyl chloride, ethyl bromide, ethyl iodide, propyl chloride, propyl bromide, propyl iodide, butyl chloride, butyl bromide, butyl iodide, hexyl chloride, bromide hexyl, octyl chloride, octyl bromide, decyl chloride, and the like.

Examples of the carboxy group-containing compound may include linear or branched aliphatic carboxylic compounds having 1 to 30 carbon atoms. Specific examples of such aliphatic carboxylic acid compounds may include, for example, arachidonic acid, crotonic acid, trans-2-decenoic acid, erucic acid, 3-decenoic acid, cis-4,7,10,13,16,19-docosahexaenoic acid, 4-decenoic acid, allcis-5,8,11,14,17- eicosapentaenoic acid, allcis-8,11,14-eicosatrienoic acid, cis-9-hexadecenoic acid, trans-3-hexenoic acid, trans-2-hexenoic acid, 2-heptenoic acid, 3-heptenoic acid, 2-hexadecenoic acid, linolenic acid, linoleic acid, γ-linolenic acid, 3-nonenoic acid, 2-nonenoic acid, trans-2-octenoic acid, petroseric acid, elaidic acid, oleic acid, 3-octenoic acid, trans-2-pentenoic acid, trans-3-pentenoic acid, ricinolic acid, sorbic acid, 2-tridecenoic acid, cis-15-tetrachosenoic acid, 10-undecenoic acid, 2-undecenoic acid, acetic acid, butyric acid, behenic acid, cerotinic acid, decanoic acid, arachidic acid, heneicosanoic acid, heptadecanoic acid, heptanoic acid, hexanoic acid, heptacosanoic acid, lauric acid, myristic acid, malic acid, octadecanoic acid, nonadecanoic acid, nonacosanoic acid, n-octanoic acid, palmitic acid, pentadecanoic acid, pyropionic acid, pentacosanoic acid, nonanoic acid, stearic acid, lignoceric acid, trichosanoic acid, tridecanoic acid, undecanoic acid, valeric acid, and the like.

Examples of the amino group-containing compound may include aliphatic amine compounds having a linear or branched alkyl group having 1 to 30 carbon atoms. Specific examples of such aliphatic amine compounds may include, for example, 1-amino heptadecane, 1-amino nonadecane, heptadecan-9-amine, stearyl amine, oleyl amine, 2-n-octyl-1-dodecyl amine, allyl amine, amyl amine, 2-ethoxyethyl amine, 3-ethoxypropyl amine, isobutyl amine, isoamyl amine, 3-methoxy propyl amine, 2-methoxyethyl amine, 2-methylbutyl amine, neopentyl amine, n-propyl amine, methyl amine, ethyl amine, n-butyl amine, n-pentyl amine, n-hexyl amine, n-heptyl amine, n-octyl amine, n-nonyl amine, n-decyl amine, n-undecyl amine, n-dodecyl amine, n-tridecyl amine, n-tetradecyl amine, n-pentadecyl amine, n-hexadecyl amine, n-octadecyl amine, tri(n-hexyl) amine, tri (n-octyl) amine, tri(n-decyl) amine, and the like.

Examples of the mercapto group-containing compound may include hexyl mercaptan, octyl mercaptan, and lauryl mercaptan.

Examples of the sulfide group-containing compound may include dialkyl sulfides such as dibutyl sulfide.

Examples of the sulfoxide group-containing compound may include dialkyl sulfoxides such as dimethyl sulfoxide and dibutyl sulfoxide.

Examples of the phosphine group-containing compound may include trialkyl phosphines such as tripropyl phosphine, tributyl phosphine, trihexyl phosphine, and trioctyl phosphine.

Examples of the phosphine oxide group-containing compound may include trialkyl phosphine oxides such as tripropyl phosphine oxide, tributyl phosphine oxide, trihexyl phosphine oxide, trioctyl phosphine oxide, and tridecyl phosphine oxide.

Examples of the heterocyclic ring group-containing compound may include a nitrogen-containing heterocyclic ring-containing compound such as pyridine, lutidine, collidine, and quinolines; and a sulfur-containing heterocyclic ring compound such as thiophene.

Among these organic ligands, at least one selected from a halogenated alkyl compound, a mercapto group-containing compound, and an aliphatic carboxylic acid compound may be used from the viewpoint of dispersion stability and light emitting properties of quantum dots. In addition, the organic ligand may be at least one selected from oleic acid, heptanoic acid, hexanoic acid, heptacosanoic acid, lauric acid, hexyl mercaptan, octyl mercaptan, and lauryl mercaptan.

The amount of organic ligands, e.g, a weight percent of organic ligand coordinated to the quantum dots based on the total weight of the quantum dots and the coordinated ligand, is not particularly limited. However, from the perspective of film thickness control of a quantum dot film following ejection of an ink composition in an inkjet printing process, the coordinated ligand may be present in an amount of about 0.5 weight percent (wt %) to about 15 wt %.

The term "an amount of organic ligand coordinated to a plurality of quantum dots" refers to the amount of organic ligand coordinated to the surface of the plurality of quantum dots and is determined by the difference in total weight of plurality of quantum dots with the organic coordinated ligand and the plurality of quantum dots without the organic coordinated ligand. For example, the organic ligand coordinated to the plurality of quantum dots may be removed by heat-treating the plurality of quantum dots with the organic coordinated ligand, whereby the weight of the plurality of quantum dots without the organic coordinated ligand may be determined. However, the method of determining the amount of the organic ligand coordinated to quantum dots is not limited to the above method, and there are various known methods of determining the amount of the organic ligand coordinated to quantum dots in the relevant art.

The quantum dots in which an organic ligand having a coordinating group is coordinated on the surface may be synthesized according to, for example, J. Am. Chem. Soc., 115, pp. 8706-8715 (1993), J. Phys. Chem., 101, pp. 9463-9475 (1997), Nature volume 575, pp. 634-638 (2019), and the like. Moreover, commercially available products may also be used.

An amount of the plurality of quantum dots in the ink composition according to an embodiment may be greater than or equal to about 0.5 weight percent (wt %), for example, greater than or equal to about 2.0 wt %, or greater than or equal to about 3.0 wt % based on the total weight (100 wt %) of the ink composition. In addition, the amount of the plurality of quantum dots in the ink composition of an embodiment may be less than or equal to about 15 wt %, for example, less than or equal to about 10 wt %, or less than or equal to about 8 wt % based on the total weight of the ink composition.

In an exemplary embodiment, an amount of the plurality of quantum dots in the ink composition may be greater than or equal to about 0.5 wt % and less than or equal to about 15 wt %, for example, greater than or equal to about 2 wt % and less than or equal to about 10 wt %, or for example, greater than or equal to about 3 wt % and less than or equal to about 8 wt % based on the total weight of the ink composition.

Mixed Solvent

The quantum dot ink composition according to an embodiment includes a mixed solvent including a Solvent a and a Solvent b. Hereinafter, the mixed solvent will be described in detail.

Solvent a

Solvent a may be a cycloalkane compound with at least a ring carbon having a linear C4 to C16 alkyl group, an aromatic hydrocarbon compound having a linear C2 to C12 alkyl group, or a combination thereof.

Solvent a may be a commercially available product (solvent) or a selectively prepared product (solvent).

In addition, Solvent a may have various stereoisomers, but the stereo-configuration of the C4 to C16 alkyl group of Solvent a is not particularly limited and may be a single stereoisomer or a mixture of various stereoisomers in an arbitrary ratio.

Hereinafter, the cycloalkane compound with at least a ring carbon having a linear C4 to C16 alkyl group may simply be referred to as "a cycloalkane compound", and the aromatic hydrocarbon compound having a linear C2 to C12 alkyl group may simply be referred to as "an aromatic hydrocarbon compound".

Cycloalkane Compound with at Least a Ring Carbon Having a Linear C4 to C16 Alkyl Group Examples of a linear C4 to C16 alkyl group, which may be included in the cycloalkane compound, may include an n-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, and the like. The cycloalkane compound may have only one linear C4 to C16 alkyl group or may have two or more linear C4 to C16 alkyl groups attached to the same or different ring carbon.

Further, the cycloalkane compound may further have a linear or branched C1 to C3 alkyl group in addition to the linear C4 to C16 alkyl group attached to the same or different ring carbon.

Further, the cycloalkane compound may further have a branched C4 to C16 alkyl group in addition to the linear C4 to C16 alkyl group attached to the same or different ring carbon.

Also, the number of ring carbons in the cycloalkane ring moiety of the cycloalkane compound may be 4 or more and 12 or less, for example, 5, 6, 7 or more and 10 or less. Examples of such cycloalkanes may include cyclobutane, cyclopentane, cyclohexane, cycloheptane, cyclooctane, cyclononane, cyclodecane, cycloundecane, cyclododecane, and the like.

Specific examples of the cycloalkane compound may include, for example, n-butyl cyclobutane, n-pentyl cyclobutane, n-hexyl cyclobutane, n-heptyl cyclobutane, n-octyl cyclobutane, n-nonyl cyclobutane, n-decyl cyclobutane, n-undecyl cyclobutane, n-dodecyl cyclobutane, n-tridecyl cyclobutane, n-tetradecyl cyclobutane, n-pentadecyl cyclobutane, n-hexadecyl cyclobutane, di(n-butyl) cyclobutane, di(n-pentyl) cyclobutane, di(n-hexyl) cyclobutane, di(n-octyl) cyclobutane; n-butyl cyclopentane, n-pentyl cyclopentane, n-hexyl cyclopentane, n-heptyl cyclopentane, n-octyl cyclopentane, n-nonyl cyclopentane, n-decyl cyclopentane, n-undecyl cyclopentane, n-dodecyl cyclopentane, n-tridecyl cyclopentane, n-tetradecyl cyclopentane, n-pentadecyl cyclopentane, n-hexadecyl cyclopentane, di(n-butyl) cyclopentane, di(n-pentyl) cyclopentane, di(n-hexyl) cyclopentane, di(n-octyl) cyclopentane; n-butyl cyclohexane, n-pentyl cyclohexane, n-hexyl cyclohexane, n-heptyl cyclohexane, n-octyl cyclohexane, n-nonyl cyclohexane, n-decyl cyclohexane, n-undecyl cyclohexane, n-dodecyl cyclohexane, n-tridecyl cyclohexane, n-tetradecyl cyclohexane, n-pentadecyl cyclohexane, n-hexadecyl cyclohexane, di(n-butyl) cyclohexane, di(n-pentyl) cyclohexane, di(n-hexyl) cyclohexane, di(n-octyl) cyclohexane; n-butyl cycloheptane, n-pentyl cycloheptane, n-hexyl cycloheptane, n-heptyl cycloheptane, n-octyl cycloheptane, n-nonyl cycloheptane, n-decyl cycloheptane, n-undecyl cycloheptane, n-dodecyl cycloheptane, n-tridecyl cycloheptane, n-tetradecyl cycloheptane, n-pentadecyl cycloheptane, n-hexadecyl cycloheptane, di(n-butyl) cycloheptane, di(n-pentyl) cycloheptane, di(n-hexyl) cycloheptane, di(n-octyl) cycloheptane; n-butyl cyclooctane, n-pentyl cyclooctane, n-hexyl cyclooctane, n-heptyl cyclooctane, n-octyl cyclooctane, n-nonyl cyclooctane, n-decyl cyclooctane, n-undecyl cyclooctane, n-dodecyl cyclooctane, n-tridecyl cyclooctane, n-tetradecyl cyclooctane, n-pentadecyl cyclooctane, n-hexadecyl cyclooctane, di(n-butyl) cyclooctane, di(n-pentyl) cyclooctane, di(n-hexyl) cyclooctane, di(n-octyl) cyclooctane; n-butyl cyclononane, n-pentyl cyclononzan, n-hexyl cyclononane, n-heptyl cyclononane, n-octyl cyclononane, n-nonyl cyclononane, n-decyl cyclononane, n-undecyl cyclononane, n-dodecyl cyclononane, n-tridecyl cyclononane, n-tetradecyl cyclononane, n-pentadecyl cyclononane, n-hexadecyl cyclononane, di(n-butyl) cyclononane, di(n-pentyl) cyclononane, di(n-hexyl) cyclononane, di(n-octyl) cyclononane; n-butyl cyclodecane, n-pentyl cyclodecane, n-hexyl cyclodecane, n-heptyl cyclodecane, n-octyl cyclodecane, n-nonyl cyclodecane, n-decyl cyclodecane, n-undecyl cyclodecane, n-dodecyl cyclodecane, n-tridecyl cyclodecane, n-tetradecyl cyclodecane, n-pentadecyl cyclodecane, n-hexadecyl cyclodecane, di(n-butyl) cyclodecane, di(n-pentyl) cyclodecane, di(n-hexyl) cyclodecane, di(n-octyl) cyclodecane; n-butyl cycloundecane, n-pentyl cycloundecane, n-hexyl cycloundecane, n-heptyl cycloundecane, n-octyl cycloundecane, n-nonyl cycloundecane, n-decyl cycloundecane, n-undecyl cycloundecane, n-dodecyl cycloundecane, n-tridecyl cycloundecane, n-tetradecyl cycloundecane, n-pentadecyl cycloundecane, n-hexadecyl cycloundecane, di(n-butyl) cycloundecane, di(n-pentyl) cycloundecane, di(n-hexyl) cycloundecane, di(n-octyl) cycloundecane; n-butyl cyclododecane, n-pentyl cyclododecane, n-hexyl cyclododecane, n-heptyl cyclododecane, n-octyl cyclododecane, n-nonyl cyclododecane, n-decyl cyclododecane, n-undecyl cyclododecane, n-dodecyl cyclododecane, n-tridecyl cyclododecane, n-tetradecyl cyclododecane, n-pentadecyl cyclododecane, n-hexadecyl cyclododecane, di(n-butyl) cyclododecane, di(n-pentyl) cyclododecane, di(n-hexyl) cyclododecane, di(n-octyl) cyclododecane, and the like.

Aromatic Hydrocarbon Compound with at Least a Ring Carbon Having a Linear C2 to C12 Alkyl Group Examples of a linear C2 to C12 alkyl group, which may be included in the aromatic hydrocarbon compound, may include, for example, an ethyl group, an n-propyl group, an n-butyl group, an n-pentyl group, an n-hexyl group, an n-heptyl group, an n-octyl group, an n-nonyl group, an n-decyl group, an n-undecyl group, an n-dodecyl group, and the like.

The aromatic hydrocarbon compound may have only one linear C2 to C12 alkyl group or may have two or more linear C2 to C12 alkyl groups, attached to the same or different ring carbon. In addition to the at least one linear C2 to C12 alkyl group off of a ring carbon, the aromatic hydrocarbon compound may include a methyl group and/or a branched C3 to C12 alkyl group attached to the same or a different ring carbon.

In many instances, the aromatic hydrocarbon ring moiety of the aromatic hydrocarbon compound may have 6 to 12 aromatic ring carbons. Also, the aromatic hydrocarbon ring moiety may be monocyclic, condensed polycyclic, or an assembly of aromatic or non-aromatic rings, e.g., with each ring of the assembly connected by known organic linkers or a single bond.

Examples of the aromatic hydrocarbon compound may include, for example, benzene, indene, naphthalene, biphenyl, and the like.

Specific examples of the aromatic hydrocarbon compound may include, for example, 1-ethyl naphthalene, 2-ethyl naphthalene, 1-n-propyl naphthalene, 2-n-propyl naphthalene, 1-n-butyl naphthalene, 2-n-butyl naphthalene, 1-n-pentyl naphthalene, 2-n-pentyl naphthalene, 1-n-hexyl naphthalene, 2-n-hexyl naphthalene, 1-n-heptyl naphthalene, 1-n-octyl naphthalene, 1-n-nonyl naphthalene, 1-n-decyl naphthalene, 1-n-undecyl naphthalene, 1-n-dodecyl naphthalene, 1,4-diethyl naphthalene, 1,4-di(n-propyl)naphthalene, 1,4-di(n-butyl)naphthalene, 1,4-di(n-pentyl)naphthalene, 1,4-di(n-hexyl)naphthalene, and the like;

2-ethyl biphenyl, 3-ethyl biphenyl, 4-ethyl biphenyl, 2-n-propyl biphenyl, 3-n-propyl biphenyl, 4-n-propyl biphenyl, 2-n-butyl biphenyl, 3-n-butyl biphenyl, 4-n-butyl biphenyl, 2-n-pentyl biphenyl, 3-n-pentyl biphenyl, 4-n-pentyl biphenyl, 2-n-hexyl biphenyl, 3-n-hexyl biphenyl, 4-n-hexyl biphenyl, 4-n-heptyl biphenyl, 4-n-octyl biphenyl, and the like;

ethyl benzene, n-propyl benzene, n-butyl benzene, n-pentyl benzene, n-hexyl benzene, n-heptyl benzene, n-octyl benzene, n-nonyl benzene, n-decyl benzene, n-undecyl benzene, n-dodecyl benzene, 1,2-diethyl benzene, 1,3-diethyl benzene, 1,4-diethyl benzene, 1,2-di(n-propyl)benzene, 1,3-di(n-propyl) benzene, 1,4-di(n-propyl) benzene, 1,2-di (n-butyl) benzene, 1,3-di (n-butyl) benzene, 1,4-di (n-butyl) benzene, 1,4-di (n-pentyl) benzene, 1,4-di(n-hexyl) benzene, 1,4-di(n-heptyl) benzene, 1,4-di(n-octyl)benzene, 1,4-di(n-nonyl) benzene, 1,4-di(n-decyl) benzene, 1,4-di(n-undecyl) benzene, 1,4-di(n-dodecyl) benzene, and the like;

1-ethyl indene, 2-ethyl indene, 3-ethyl indene, 4-ethyl indene, 5-ethyl indene, 6-ethyl indene, 7-ethyl indene, 1-n-propyl indene, 2-n-propyl indene, 3-n-propyl indene, 4-n-propyl indene, 5-n-propyl indene, 6-n-propyl indene, 7-n-propyl indene, 1-n-butyl indene, 2-n-butyl indene, 3-n-butyl indene, 4-n-butyl indene, 5-n-butyl indene, 6-n-butyl indene, 7-n-butyl indene, and the like.

Among the above-named list of solvents a, the mixed solvent may include at least one of n-decyl cyclohexane, n-undecyl cyclohexane, n-dodecyl cyclohexane, n-tridecyl cyclohexane, n-octyl benzene, n-nonyl benzene, n-decyl benzene, and n-dodecyl benzene, as such solvents have favorable viscosity and/or vapor pressure.

Solvent b

The fluorinated alcohol as the solvent b is an alcohol in which at least a part of hydrogen atoms are substituted with fluorine atoms, and may impart high surface tension to the ink. The structure of the solvent b may be linear, branched, or cyclic. In addition, the solvent b may be a primary alcohol, a secondary alcohol, or a tertiary alcohol.

The solvent b may be used alone or in combination of two or more solvent b solvents. In addition, the solvent b may be a commercial product (solvent) or a selective prepared product (solvent).

Specific examples of solvent b may include, for example, trifluoro methanol, 2,2,2-trifluoro ethanol, 1,3-difluoro propan-2-ol, 2H-hexafluoro-2-propanol, 1,1,1,3,3,3-hexafluoro-2-(trifluoromethyl)-2-propanol, 1H,1H,3H-tetrafluoro-1-n-propanol, 1H,1H-pentafluoro-1-n-propanol, 2-trifluoromethyl-2-propanol, 1H,1H,3H-hexafluoro-1-butanol, 1H,1H,4H-hexafluoro-1-n-butanol, 1H,1H-heptafluoro-1-n-butanol, 1H,1H,5H-octafluoro-1-n-pentanol, 1H,1H-nonafluoro-1-n-pentanol, 1H, 1H-undecafluoro-1-n-hexanol, 1H,1H,6H-decafluoro-1-n-hexanol, 1H, 1H,2H, 2H-nonafluoro-1-n-hexanol, 1H,1H-tridecafluoro-1-n-heptanol, 1H,1H,7H-dodecafluoro-1-n-heptanol, 1H,1H,2H, 2H-tridecafluoro-1-n-octanol;

1H,1H,8H-tetradecafluoro-1-n-octanol, 1H,1H-pentadecafluoro-1-n-octanol, 1H,1H,9H-hexadecafluoro-1-n-nonanol, 1H,1H,2H,2H-heptadeca fluoro-1-n-decanol, 1H,1H-tricosa fluoro-1-n-dodecanol, and the like.

Among these, the fluorinated alcohol may be an aliphatic primary alcohol having 6 or more and 12 or less carbon atoms in which at least a part of hydrogen atoms are substituted with fluorine atoms, from the viewpoint of affinity with organic solvents and vapor pressure. For example, a fluorinated alcohol may include 1H,1H,2H,2H- nonafluoro-1-hexanol, 1H,1H-tridecafluoro-1-heptanol, 1H,1H,2H,2H-tridecafluor-1-n-octanol, 1H,1H,2H,2H-heptadecafluoro-1-decanol, 1H,1H-tricosafluoro-1-dodecanol, and the like.

An amount of solvent b in the mixed solvent may be 0.01 part by volume or more, for example, 0.05 part by volume or more, based on 100 parts by volume of solvent a (when two or more solvents a are included, the total volume of the solvents a is 100 parts by volume). Further, the amount of solvent b may be 50 parts by volume or less, 30 parts by volume or less, 20 parts by volume or less, for example, 5.0 parts by volume or less, with respect to 100 parts by volume of the solvent a (100 parts by volume of the total volume when two or more solvents a are included). Likewise, when two or more types of solvent b are included, the amount of solvent b means the total amount of the two or more solvents b.

For example, the amount of solvent b may be 0.01 part by volume or more and 50 parts by volume or less, 0.01 part by volume or more and 30 parts by volume or less, 0.01 part by volume or more and 20 parts by volume or less, 0.05 parts by volume or more and 10 parts by volume or less, for example, 0.05 parts by volume or more and 5.0 parts by volume or less.

As described above, even when a small amount of solvent b is added, e.g., 0.01 part by volume or more and less than 3 parts by volume, or even less than 1 part by volume, the quantum dot ink composition according to the embodiment may have excellent dispersion stability of the quantum dots, landing properties of the ink composition, and film flatness of the film prepared from the ink-jet printed ink composition.

Solvent c

The mixed solvent according to an embodiment may further include Solvent c. Solvent c may, for example, be a compound (solvent) that may further impart the desired surface tension to the ink composition.

For example, solvent c may have a surface tension of greater than or equal to about 32 mN/m, for example, greater than or equal to about 33 mN/m, or for example greater than or equal to about 35 mN/m.

The upper limit of the surface tension of Solvent c is not particularly limited, but may be, for example, about 50 mN/m.

Solvent c may be used alone or in combination of two or more solvent c solvents. In addition, Solvent c may be a commercial product (solvent) or a selective prepared product (solvent).

Solvent c may be a compound having an aromatic hydrocarbon ring or a compound having an aromatic heterocyclic ring. The compound having an aromatic hydrocarbon ring may be an aromatic compound containing a functional group selected from a halogen group, an alkyl group, an alkoxy group, an alkenyl group, an aldehyde group, a ketone group, an ether group, a carboxy group, an ester group, a nitro group, and an amide group.

Examples of the compound having an aromatic heterocyclic ring may include compounds having an oxygen-containing aromatic heterocyclic ring, a nitrogen-containing aromatic heterocyclic ring, or a sulfur-containing aromatic heterocyclic ring.

More specific examples of solvent c may include 1-methyl naphthalene, 2-methyl naphthalene, 1,2-dimethyl naphthalene, 1,3-dimethyl naphthalene, 1,4-dimethyl naphthalene, 1,6-dimethyl naphthalene, 1,7-dimethyl naphthalene, 1-phenyl naphthalene, 1-vinyl naphthalene; ethyl 4-methyl benzoate, methyl 4-tert-butyl benzoate, n-propyl benzoate, n-butyl benzoate, n-pentyl benzoate, n-hexyl benzoate, isopentyl benzoate, 2-ethylhexyl benzoate, 2-methyl ethyl benzoate, 2-ethoxyethyl benzoate, benzyl benzoate; N,N-dimethyl benzamide, N,N-dimethyl-3-methyl benzamide, N,N-dimethyl-2,3-dimethyl benzamide, N-methoxy-N-methyl benzamide, 2-methylbenzophenone, 3-methyl-benzophenone, thiophene, 3,4-ethylenedioxythiophene, 2-methyl-2,3-dihydrothieno[3,4-b]-1,4-dioxine, 2-ethyl-2,3-dihydrothieno[3,4-b]-1,4-dioxin, diphenyl ether, dibenzyl ether, dimethyl phthalate, diethyl phthalate, 1'-acetonaphthone, 1-methoxy-4-methyl naphthalene, methyl-1-naphthate, methyl-1-naphthalene acetate, ethyl-1-naphthalene acetate, 2-methyl benzo[e]indene, and the like.

Among the above listing of solvents c, at least one of 1-phenyl naphthalene, benzyl benzoate, n-butyl benzoate, 1-methyl naphthalene, 2-methyl benzophenone, 3-methyl benzophenone, and 1'-acetonaphthone may be included.

When the mixed solvent includes solvent c, an amount of solvent c may be greater than or equal to about 5 parts by volume, for example, greater than or equal to about 10 parts by volume, or for example, greater than or equal to about 15 parts by volume, with respect to 100 parts by volume of solvent a (when two or more kinds of solvents a are included, the amount of solvent a is the total amount of the two or more solvents a).

Further, the amount of solvent c, if present, may be less than or equal to about 40 parts by volume, for example, less than or equal to about 35 parts by volume, or for example, less than or equal to about 30 parts by volume, or less than or equal to about parts by volume, with respect to 100 parts by volume of solvent a (when two or more kinds of solvents a are included, the amount of solvent a is the total amount of the two or more solvents a). Likewise, when two or more types of solvent c are included, the amount of solvent c means the total amount of the two or more of solvents c.

Solubility Parameter

From the viewpoint of further improving the dispersion stability of the quantum dots, it may be advantageous that the solubility parameter of the mixed solvent included in the ink composition of an embodiment is close to the solubility parameter of the organic ligand bound to the surface of the quantum dots.

For example, the absolute value of the difference between the solubility parameter of the mixed solvent and the solubility parameter of the organic ligand [(solubility parameter of the mixed solvent)−(solubility parameter of the organic ligand)] may be less than or equal to about 1.5 $(cal/cm^3)^{1/2}$, for example, less than or equal to about 1.0 $(cal/cm^3)^{1/2}$, or less than or equal to about 0.7 $(cal/cm^3)^{1/2}$.

The lower limit of the absolute value of the difference is zero.

The solubility parameter of the solvent described herein is a value calculated by Fedors' estimation method. For example, based on R. F. Fedors, Polym. Eng. Sci., 14(2), pp. 147-154 (1974), referring to $\Delta ei$ and $\Delta vi$ related to the structure of the solvent, the solubility parameter of the solvent group is calculated by the following equation (unit: $(cal/cm^3)^{1/2}$).

$$\delta = (\Sigma_i \Delta ei / \Sigma_i \Delta vi)^{1/2} \quad \text{(Equation)}$$

A solubility parameter of the mixed solvent adopts an added value obtained by weighing the obtained solubility parameter (SP) of each solvent according to a volume fraction of each solvent in the mixed solvent.

The solubility parameter of the mixed solvent may be controlled by appropriately selecting types of each solvent included in the mixed solvent, an amount ratio of each solvent, and the like.

The term "solubility parameter of an organic ligand" refers to a solubility parameter, when the corresponding organic ligand is coordinated to the surface of the quantum dot, and for example, is calculated from a structure excluding a substituent of the organic ligand adsorbed on the surface of the quantum dot.

The ink composition of an embodiment may include various additives, as needed. Examples of the additives may include a host material, an antioxidant, a leveling agent, a plasticizer, a surfactant, an antifoaming agent, a silane coupling agent, an ultraviolet absorber, and adhesion promoters that may be used in the light emitting layer.

Examples of the host material may include, for example, a compound having a carbazole skeleton, a compound having a diarylamine skeleton, a compound having a pyridine skeleton, a compound having a pyrazine skeleton, a compound having a triazine skeleton, and a compound having an aryl silane skeleton, but are not limited thereto.

An addition amount of the additives may be appropriately determined according to the purpose within a range that does not impair the purpose of an embodiment.

In addition, within a range that does not impair the dispersive stability and/or landing properties, ink composition of an embodiment may further include a solvent other than the aforementioned Solvent a, Solvent b or Solvent c. Examples of such other solvents may include 1-hexanol, 1-heptanol, 1-octanol, 1-nonanol, 1-decanol, 1-undecanol, 1-dodecanol, (+)-limonene, ethylene glycol mono butyl ether, α-terpineol, propylene carbonate, dimethyl sulfoxide, N, N-dimethylformamide, 1-bromo-octane, 1-bromo nonane, 1-bromodecane, 1-bromododecane, etc., but are not limited thereto.

An amount of these other solvents may be less than or equal to about 10 parts by volume, or for example, less than or equal to about 5 parts by volume, with respect to 100 parts by volume of the mixed solvent.

In an embodiment, no other solvents other than Solvent a, Solvent b, and/or Solvent c may be included.

Method for Preparing Ink Composition

A method for preparing the quantum dot ink composition of an embodiment is not particularly limited. For example, the quantum dot, Solvent a, Solvent b, and other components added as needed may be mixed at once, or a method of sequentially mixing each component may be used.

However, from the viewpoint of further enhancing the dispersibility of the quantum dots, a method of preparing a mixed solvent by mixing Solvent a and Solvent b in advance, followed by adding the obtained mixed solvent to a separately prepared quantum dots, and then stirring the mixture, may provide technical advantages.

The temperature at the time of mixing is not particularly limited, but may be, for example, in the range of about 20° C. to about 30° C.

Also, the mixing time is not particularly limited, but may be, for example, in the range of about 0.1 hour to about 1 hour.

Physical Properties of Ink Composition

The surface tension of the ink composition of an embodiment is about 30 milliNewtons per meter (mN/m) to about 40 mN/m. When the ink composition has surface tension of less than 30 mN/m, satellite droplets are more easily formed or present resulting in a deterioration of landing properties. In addition, when the surface tension of the ink composition is higher than 40 mN/m, flatness of the ink composition after landing in a bank is shown to deteriorate, which may cause a decrease in device efficiency.

The surface tension of the ink composition may have a low limit of greater than or equal to about 31 mN/m, for example, greater than or equal to about 32 mN/m.

The surface tension of the ink composition may be less than or equal to about 39 mN/m, for example, less than or equal to about 38 mN/m.

The surface tension of the ink composition according to an embodiment may be about 31 mN/m to about 39 mN/m, for example, about 32 mN/m to about 38 mN/m.

The surface tension of the ink composition may be controlled by appropriately selecting types of each solvent included in the mixed solvent, an amount ratio of each solvent, and the like.

The quantum dot ink composition according to an embodiment may have viscosity of about 4 milliPascals seconds (mPa·s) to about 10 mPa·s or about 4.5 mPa·s to about 8.0 mPa·s. The listed range of viscosity is shown to provide an improvement of ejection stability as the ink composition is continuously ejected from a inkjet nozzle.

The viscosity of the quantum dot ink composition may be measured in a method described in the examples.

A quantum dot ink composition having the aforementioned composition according to an embodiment may have a photoluminescence quantum yield (PLQY) of about 85% to about 100%, for example, about 90% to about 100%, or about 95% to about 100%. When PLQY is within the range, excellent dispersion stability of quantum dots may be achieved.

PLQY is measured by adopting a method described in the examples.

The ink composition according to an embodiment is not particularly limited with respect to use but may be, for example, be used for forming a quantum dot-containing layer of various optical members in a display device and the like. In addition, the ink composition according to an embodiment is suitable for forming the quantum dot-containing layer using an inkjet process. The optical members may include, for example, a semiconductor optical member such as a semiconductor optical member, a light emitting member, and the like.

For example, the quantum dot ink composition according to an embodiment may be used to form a light emitting layer of a quantum dot electroluminescent device. In another embodiment provides a quantum dot electroluminescent device having a light emitting layer formed of the quantum dot ink composition according to an embodiment.

Hereinafter, this quantum dot electroluminescent device will be described in detail.

Referring to FIG. 1, a quantum dot electroluminescent device according to an embodiment will be described in detail. FIG. 1 is a schematic representation showing a quantum dot electroluminescent device according to an embodiment. In the present specification, "quantum dot electroluminescent device" may be abbreviated as "QLED."

As shown in FIG. 1, the QLED 100 according to an embodiment includes a substrate 110, a first electrode 120 on the substrate 110, a hole injection layer 130 on the first electrode 120, a hole transport layer 140 on the hole injection layer 130, a light emitting layer 150 on the hole transport layer 140, an electron transport layer 160 on the light emitting layer 150, an electron injection layer 170 on the electron transport layer 160, and a second electrode 180 on the electron injection layer 170.

The film formation method of layers other than the light emitting layer 150 is not particularly limited. The layers other than the light emitting layer 150 may be formed by, for example, a vacuum deposition method or a solution application method using methods well known to those of ordinary skill in the relevant art as follows. Examples of the solution application method may include a spin coat method, a casting method, a micro gravure coating method, a gravure coating method, a bar coat method, a roll coating method, a wire bar coat method, a dip coat method, a spray coat method, a screen-printing method, a flexographic printing method, an offset printing method, an inkjet printing method, and the like.

When the layers other than the light emitting layer 150 are formed by a solution application method, examples of the solvent used may include toluene, xylene, ethyl benzene, diethylbenzene, mesitylene, propyl benzene, cyclohexyl benzene, dimethoxy benzene, anisole, ethoxy toluene, phenoxy toluene, isopropyl biphenyl, dimethyl anisole, phenyl acetate, phenyl propionate, methyl benzoate, ethyl benzoate, cyclohexane, and the like. An amount of solvent used in the coating liquid is not particularly limited.

As the substrate 110, a substrate used in general EL devices may be used. For example, the substrate 110 may be a semiconductor substrate such as a glass substrate or a silicon substrate, or a transparent plastic substrate.

A first electrode 120 is formed on the substrate 110. The first electrode 120 may be, for example, an anode, and may be formed of a metal, an alloy, or a conductive compound having a large work function. For example, the first electrode 120 may be made of indium tin oxide ($In_2O_3$—$SnO_2$: ITO), indium zinc oxide ($In_2O_3$—ZnO), tin oxide ($SnO_2$), zinc oxide (ZnO), etc., which have improved transparency and conductivity, as a transmissive electrode.

The first electrode 120 may be formed as a reflective electrode by laminating magnesium (Mg), aluminum (Al), or the like on the transparent conductive film.

In addition, after forming the first electrode 120 on the substrate 110, cleaning and UV-ozone treatment may be performed, if necessary.

A hole injection layer 130 is formed on the first electrode 120. The hole injection layer 130 may be a layer that facilitates hole injection from the first electrode 120 and may be formed with the following thickness (dry film thickness; hereinafter the same), for example, greater than or equal to about 10 nm and less than or equal to about 1000 nm, for example, greater than or equal to about 20 nm and less than or equal to about 300 nm.

The hole injection layer 130 may be formed of a known hole injection material. The known hole injection material forming the hole injection layer 130 may be, for example triphenylamine-containing polyether ketone (poly(ether ketone)-containing triphenylamine: TPAPEK), 4-isopropyl-4'-methyldiphenyliodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino) triphenylamine (m-MTDATA), N,N'-di(1-naphthyl)-N,N'-diphenylbenzidine (NPB), 4,4',4"-tris(diphenylamino) triphenylamine (TDATA), 4,4',4"-tris(N, N-2-naphthylphenylamino)triphenylamine (2-TNATA), polyaniline/dodecylbenzenesulfonic acid, poly(3,4-ethylenedioxythiophene)/poly(4-styrenesulfonate) (PEDOT/PSS), polyaniline/10-camphorsulfonic acid, and the like, but is not limited thereto.

The hole transport layer 140 is formed on the hole injection layer 130. The hole transport layer 140 is a layer having a function of transporting holes, and may be formed to a thickness of, for example, greater than or equal to about 10 nm and less than or equal to about 150 nm, for example, greater than or equal to about 20 nm and less than or equal to about 50 nm.

The hole transport layer 140 may be formed of a known hole transport material. The known hole transport material may be, for example, 1,1-bis[(di-4-tolylamino)phenyl]cyclohexane (TAPC), a carbazole derivative such as N-phenyl carbazole and polyvinyl carbazole, N,N'-bis (3-methylphenyl)-N,N'-diphenyl-[1,1-biphenyl]-4,4'-diamine (TPD), 4,4', 4"-tris(N-carbazolyl) triphenylamine (TCTA), N,N'-di(1-naphthyl)-N,N'-diphenylbenzidine (NPB), poly[(9,9-dioctylfluoren-2,7-diyl)-co-(4,4'-(N-(4-sec-butylphenyl) diphenylamine) (TFB), and the like, but is not limited thereto.

These hole transport materials may be used alone or as a mixture of two or more.

The light emitting layer 150 is formed on the hole transport layer 140. The light emitting layer 150 includes quantum dots, and, as described above, may be formed by using, for example, an inkjet printing process using an ink composition according to an embodiment. The light emitting layer 150 may be formed to a thickness of, for example, greater than or equal to about 10 nm and less than or equal to about 60 nm, for example, greater than or equal to about 20 nm and less than or equal to about 50 nm.

Because the ink composition according to an embodiment has a relatively high surface tension together with a relatively high viscosity, the light emitting layer formed therefrom has good or an acceptable flatness, particularly, acceptable flatness as deposited into a bank substrate. As an example, the flatness may be, for example, greater than or equal to about 53%, for example, greater than or equal to about 55%. The upper limit of flatness is 100%.

In an embodiment, the flatness of the light emitting layer may be greater than or equal to about 53% and less than or equal to about 100%, for example, greater than or equal to about 55% and less than or equal to about 100%. The flatness is a value measured by the method described in examples.

The electron transport layer 160 is formed on the light emitting layer 150. The electron transport layer 160 is a layer having a function of transporting electrons, and may be formed using a vacuum deposition method, a spin coating method, an inkjet method, or the like. The electron transport layer 160 may be formed with a thickness of, for example, greater than or equal to about 15 nm and less than or equal to about 50 nm.

The electron transport layer 160 may be formed using a known electron transport material. The electron transport material may be an organic material or an inorganic material. The known organic electron transport material may be, for example, (8-) lithium (lithium quinolate) (Liq), tris (8-) aluminum (tris (8-quinolinato) aluminum: Alq3), and a compound having a nitrogen-containing aromatic ring.

Specific example of the compound having a nitrogen-containing aromatic ring may be, for example, a compound containing a pyridine ring such as 1,3,5-tri[(3-pyridyl)-phen-3-yl]benzene, a compound containing a triazine ring such as 2,4,6-tris(3'-(pyridin-3-yl)biphenyl-3-yl)-1,3,5-triazine, a compound containing an imidazole ring such as 2-(4-(N-phenylbenzoimidazolyl-1-yl-phenyl)-9,10-dinaphthylanthracene, 1,3,5-tris(N-phenyl-benzimidazol-2-yl)benzene (TPBI), and, but are not limited thereto.

In addition, the known inorganic electron transport material is not particularly limited, and examples thereof may include oxides such as $TiO_2$, $ZnO$, $ZnMgO$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, and the like. The electron transport material may be used alone or in combination of two or more.

The electron injection layer 170 is formed on the electron transport layer 160. The electron injection layer 170 is a layer having a function of facilitating injection of electrons from the second electrode 180.

The electron injection layer 170 may be formed using a vacuum deposition method or the like. The electron injection layer 170 may have a thickness of greater than or equal to about 0.1 nm and less than or equal to about 5 nm, for example, greater than or equal to about 0.3 nm and less than or equal to about 2 nm.

Any known material for forming the electron injection layer 170 may be used. For example, the electron injection layer 170 may include lithium compounds such as (8-) lithium (lithium quinolate) ((8-quinolinato)lithium: Liq) and lithium fluoride (LiF), sodium chloride (NaCl), cesium fluoride (CsF), lithium oxide ($Li_2O$), or barium oxide (BaO).

The second electrode 180 is formed on the electron injection layer 170. The second electrode 180 may be formed using a vacuum deposition method or the like.

The second electrode 180 is, specifically, a cathode, and may be formed of a metal, an alloy, or a conductive compound having a low work function. For example, the second electrode 180 may be formed of a metal such as lithium (Li), magnesium (Mg), aluminum (Al), or calcium (Ca), or an alloy such as aluminum-lithium (Al—Li), magnesium-indium (Mg—In), or magnesium-silver (Mg—Ag), as a reflective electrode.

The second electrode 180 may be formed to a thickness of greater than or equal to about 10 nm and less than or equal to about 200 nm, for example, greater than or equal to about 50 nm and less than or equal to about 150 nm.

Alternatively, the second electrode 180 may be formed as a transmissive electrode by using a thin film of less than or equal to about 20 nm of the metal material, a transparent conductive film such as indium tin oxide ($In_2O_3$—$SnO_2$) or indium zinc oxide ($In_2O_3$—ZnO).

Meanwhile, the stacked structure of the QLED 100 according to the present embodiment is not limited to the above embodiment.

The QLED 100 according to this embodiment may be formed in other known laminated structures. For example, in the QLED 100, one or more layers of the hole injection layer 130, the hole transport layer 140, the electron transport layer 160, and the electron injection layer 170 may be omitted, and other layers may be further added.

In addition, each layer of the QLED 100 may be formed as a single layer, or may be formed as a plurality of layers. For example, the QLED 100 may further include a hole blocking layer between the electron transport layer 160 and the light emitting layer 150 to prevent diffusion of excitons or holes into the electron transport layer 160.

The hole blocking layer may be formed of, for example, an oxadiazole derivative, a triazole derivative, or a phenanthroline derivative.

EXAMPLES

The embodiments will be described in more detail using the following examples and comparative examples, but the technical scope of the embodiment is not limited only to the following examples. Physical properties were measured by the following methods.

Calculation of Solubility Parameter (SP Value)

A solubility parameter (SP value) of a solvent was calculated by Fedors' estimation method. Based on R. F. Fedors, Polym. Eng. Sci., 14(2), pp. 147-154 (1974), referring to $\Delta ei$ and $\Delta vi$ related to the structure of the solvent, a solubility parameter of solvent groups was calculated by the following equation.

A solubility parameter of a mixed solvent including Solvent a, Solvent b, and Solvent c, if present, was calculated by weighing SP of the solvent groups according to a volume fraction of each solvent (unit: $(cal/cm^3)^{1/2}$).

$$\delta = (\Sigma_i \Delta ei / \Sigma_i \Delta vi)^{1/2} \qquad \text{Equation}$$

Viscosity

Viscosity $\eta$ is expressed as the following equation by the relationship between shear stress r and shear rate D:

$$\eta = \tau/D$$

The ink composition was measured with respect to viscosity by using Physica MCR300 (measurement jig cone plate PP50) Anton-Paar GmbH at 25° C. Specifically, the shear stress $\tau$ was measured at 25° C. by setting a constant shear rate of 1000 $s^{-1}$ where a distance between the cone plate and die was 0.05 mm.

The viscosity of the ink composition was calculated by correcting a measurement range with 3 standard solutions having ink viscosities that belong to a viscosity region determined from viscometer calibration standard solutions JS 2.5, JS5, JS10, JS20, and JS50 (Nippon Electric Glass Co., Ltd.) and using the corrected curve.

Surface Tension

The surface tension at room temperature (i.e., greater than or equal to 20° C. and less than or equal to 25° C.) of the solvents and the ink composition were measured using DMs-400 manufactured by Kyowa Interface Science Co., Ltd. A needle used for the measurement had a size of 15 G (an interior diameter $\Phi = 1.3$ mm), which was coated with fluorine. A hanging drop method using the aforementioned device was adopted. The surface tension of the ink composition was obtained by calculating contour shape and density differences of droplets produced with a tip of the needle, fitting the differences into a Young-Laplace theory curve through an image treatment to obtain 10 surface tensions from 10 consecutively photographed images, and averaging the 10 surface tensions.

In addition, the photographed images were taken 1000 milliseconds (ms) later after the formation of the droplets. Additional technical details for measurement of surface tensions is described in Y. ROTENBERG, J. Colloid Interface Sci., 93,169(1983), and Colloid Science IV; a colloid scientific experiment method, p138, (Tokyo Chemical Dojin, edited by the Chemical Society of Japan, 1996), the disclosure of which is herein incorporated by reference.

Example 1

Quantum dot dispersion was prepared by referring to "Synthesis of InP cores" and "Synthesis of InP/ZnSe/ZnS QDs" of "Methods" of Nature volume 575, pp. 634 to 638 (2019), the disclosure of which is herein incorporated by reference. Core: InP, shell: ZnSe/ZnS, content of quantum dot in dispersion: 3 mass %, maximum emission wavelength of quantum dot: 627 nm, organic ligand of quantum dot: oleic acid (SP value, when coordinated on the surface of quantum dot: 8.1 $(cal/cm^3)^{1/2}$, particle diameter of quantum dot: 10 nanometers (nm). Ethanol was added to the obtained quantum dot dispersion to produce a precipitate, which is separated from the supernatant and collected through centrifugation.

n-dodecyl cyclohexane (Solvent a), 1H,1H,2H,2H-tride-cafluoro-1-n-octanol (solvent b) were mixed in a volume ratio of 100:0.1 (volume ratio), preparing Mixed Solvent 1. 3 mL of the Mixed Solvent 1 was added to the obtained quantum dot precipitate and stirred with a shaker (mixing temperature: 25° C., mixing time: 10 minutes) to disperse the precipitates in the Mixed Solvent 1, and obtain a Quantum Dot Ink Composition 1 (hereinafter, referred to as Ink 1).

Ink 1 has viscosity of 6.9 mPa·s and surface tension of 33 milliNewtons per meter (mN/m). The Mixed Solvent 1 had a SP value of 8.3 $(cal/cm^3)^{1/2}$, and a concentration of the quantum dots (InP/ZnSe/ZnS) in Ink 1 was 3.0 mass %.

Example 2

Quantum Dot Ink Composition 2 (hereinafter, referred to as Ink 2) was prepared in the same manner as in Example 1 except that Mixed Solvent 2 was prepared by using 1H,1H,2H,2H-nonafluoro-1-n-hexanol instead of 1H,1H,2H,2H-tridecafluoro-1-n-octanol.

Ink 2 had viscosity of 6.5 mPa·s and surface tension of 30.5 mN/m. The Mixed Solvent 2 has a SP value of 8.3 $(cal/cm^3)^{1/2}$.

Example 3

Quantum Dot Ink Composition 3 (hereinafter, referred to as Ink 3) was prepared in the same manner as in Example 1 except that Mixed Solvent 3 was prepared by using 1H,1H,2H,2H-tridecafluoro-1-n-heptanol instead of 1H,1H-tridecafluoro-1-n-octanol.

Ink 3 had viscosity of 6.8 mPa·s and surface tension of 30.1 mN/m. The Mixed Solvent 3 had a SP value of 8.3 $(cal/cm^3)^{1/2}$.

Example 4

Quantum Dot Ink Composition 4 (hereinafter, referred to as Ink 4) was prepared in the same manner as in Example 1 except that Mixed Solvent 4 was prepared by using 1H,1H,2H,2H-heptadecafluoro-1-n-decanol instead of 1H,1H,2H,2H-tridecafluoro-1-n-octanol.

Ink 4 had viscosity of 7.3 mPa·s and surface tension of 30.2 mN/m. The Mixed Solvent 4 had a SP value of 8.3 $(cal/cm^3)^{1/2}$.

Example 5

Quantum Dot Ink Composition 5 (hereinafter, referred to as Ink 5) was prepared in the same manner as in Example 1 except that Mixed Solvent 5 was prepared by using n-tridecyl cyclohexane (Solvent a) instead of n-dodecyl cyclohexane.

Ink 5 had viscosity of 7.5 mPa·s and surface tension of 30.4 mN/m. The mixed solvent 5 had a SP value of 8.3 $(cal/cm^3)^{1/2}$.

Example 6

Quantum Dot Ink Composition 6 (hereinafter, referred to as Ink 6) was prepared in the same manner as in Example 1 except that Mixed Solvent 6 was prepared by using n-dodecyl benzene (Solvent a) instead of n-dodecyl cyclohexane.

Ink 6 had viscosity of 5.0 mPa·s and surface tension of 32.3 mN/m. The mixed solvent 6 had a SP value of 8.8 $(cal/cm^3)^{1/2}$.

Example 7

Quantum Dot Ink Composition 7 (hereinafter, referred to as Ink 7) was prepared in the same manner as in Example 1 except that Mixed Solvent 7 was prepared by using 1H,1H-tricosa fluoro-1-n-dodecanol (solvent b) instead of 1H,1H,2H,2H-tridecafluoro-1-n-octanol.

Ink 7 had viscosity of 7.3 mPa·s and surface tension of 30.3 mN/m. The Mixed Solvent 7 had a SP value of 8.3 $(cal/cm^3)^{1/2}$.

Comparative Example 1

Comparative Quantum Dot Ink Composition 1 (hereinafter, referred to as Comparative Ink 1) was prepared in the same manner as in Example 1 except that the n-dodecyl cyclohexane (Solvent a) is used alone, i.e., no fluorinated alcohol of solvent b (hereinafter, referred to as Comparative solvent 1) was used.

Comparative Ink 1 had viscosity of 6.8 mPa·s and surface tension of 28.6 mN/m. Comparative solvent 1 had a SP value of 8.3 $(cal/cm^3)^{1/2}$.

Comparative Example 2

Comparative Quantum Dot Ink Composition 2 (hereinafter, referred to as Comparative Ink 2) was prepared in the same manner as in Example 1 except that Comparative Solvent 2 was prepared by mixing n-dodecyl benzene and 2-ethyl-1-hexanol in a volume ratio of 65:35, respectively.

Comparative Ink 2 had viscosity of 5.8 mPa·s and surface tension of 28.6 mN/m. Comparative solvent 2 had a SP value of 9.3 $(cal/cm^3)^{1/2}$.

Comparative Example 3

Comparative Quantum Dot Ink Composition 3 (hereinafter, referred to as Comparative Ink 3) was prepared in the same manner as in Comparative Ink 2 except that Comparative Solvent 3 was prepared by changing the ratio of n-dodecyl benzene and 2-ethyl-1-hexanol in Comparative Solvent 2 to a volume ratio of 100:0.1, respectively.

Comparative Ink 3 had viscosity of 4.9 mPa·s and surface tension of 29.1 mN/m. Comparative solvent 3 had a SP value of 8.8 $(cal/cm^3)^{1/2}$.

Comparative Example 4

Comparative Quantum Dot Ink Composition 4 (hereinafter, referred to as Comparative Ink 4) was prepared in the same manner as in Example 1 except that Comparative Solvent 4 was prepared by mixing n-octyl cyclohexane and 4-methyl cyclohexanol in a volume ratio of 50:50, respectively.

Comparative Ink 4 had viscosity of 10.5 mPa·s and surface tension of 28.4 mN/m. Comparative solvent 4 had a SP value of 9.6 $(cal/cm^3)^{1/2}$.

Compositions of the mixed solvents of each example and comparative example are shown in Table 1.

TABLE 1

| | Solvent a (Amount: parts by volume) | Solvent b (Amount: parts by volume) | SP Value $(cal/cm^3)^{1/2}$ |
|---|---|---|---|
| Example 1 | n-dodecyl cyclohexane (100) | $CF_3(CF_2)_5CH_2CH_2OH$ (0.1) | 8.3 |
| Example 2 | n-dodecyl cyclohexane (100) | $CF_3(CF_2)_3CH_2CH_2OH$ (0.1) | 8.3 |
| Example 3 | n-dodecyl cyclohexane (100) | $CF_3(CF_2)_5CH_2OH$ (0.1) | 8.3 |
| Example 4 | n-dodecyl cyclohexane (100) | $CF_3(CF_2)_7CH_2CH_2OH$ (0.1) | 8.3 |
| Example 5 | n-tridecyl cyclohexane (100) | $CF_3(CF_2)_5CH_2CH_2OH$ (0.1) | 8.3 |
| Example 6 | n-dodecyl benzene (100) | $CF_3(CF_2)_5CH_2CH_2OH$ (0.1) | 8.8 |
| Example 7 | n-dodecyl cyclohexane (100) | $CF_3(CF_2)_{10}CH_2OH$ (0.1) | 8.3 |

| | Solvent a (Amount: parts by volume) | Non-fluorinated alcohol (Amount: parts by volume) | |
|---|---|---|---|
| Comparative Example 1 | n-dodecyl cyclohexane (100) | — | 8.3 |
| Comparative Example 2 | n-dodecyl benzene (65) | 2-ethyl-1-hexanol (35) | 9.3 |
| Comparative Example 3 | n-dodecyl benzene (100) | 2-ethyl-1-hexanol (0.1) | 8.8 |
| Comparative Example 4 | n-octyl cyclohexane (50) | 4-methyl cyclohexanol (50) | 9.6 |

Evaluation

Measurement of Average Particle Diameter of Quantum Dots in Ink by Dynamic Light Scattering (DLS)

Each ink composition prepared in each Example or Comparative Example was diluted times with each Mixed Solvent or Comparative Solvent prepared and used in each Example or Comparative example, respectively, and the particle size distribution in each composition was measured using ELS-Z2 manufactured by Otsuka Electronics Co., Ltd. D50 of the obtained scattering intensity distribution was taken as the average particle diameter. If this value is in the range of 12 nm to 20 nm, it indicates that the quantum dots are stably dispersed without aggregation.

Measurement of PLQY (Photoluminescence Quantum Yield)

A volume (x) of ink composition was diluted with a volume of n-hexane (1000×) and photoluminescence was measured with respect to PLQY at a detection wavelength of 610 nm to 640 nm by using Quantaurus-QY C11347-01 manufactured by Hamamatsu Photonics Co., Ltd. When PLQY was greater than or equal to 85%, the corresponding composition turned out to have excellent dispersion stability of quantum dots.

Landing Accuracy Measurement

The ink compositions of the examples and the comparative examples were printed on a surface of an ITO glass substrate under ejection conditions of 10 pl/dot and 100 dpi by using a material (raw material) printer DMP-2850 made by FUJIFILM Dimatix, Inc. Landing accuracy was evaluated by conducting a continuous ejection test with an inkjet device. An ink was given a Pass rating if all shots landed within a radius error range of 10 micrometers (μm) from a target, or was given a Failure if any shots landed outside this radius error range.

Film Flatness (Contact Angle)

The contact angle was measured using an automatic contact angle meter DMs-400 manufactured by Kyohwa Interface Science Co., Ltd. Each ink of the Examples and Comparative Examples was taken from the tip of a Teflon-coated needle attached to a glass syringe, and 1 μL of poly [(9,9-dioctylfluoren-2,7-diyl)-co-(4,4'-(N-(4-sec-butylphenyl)diphenylamine)] (TFB) was dropped onto the coated ITO substrate, and the contact angle was obtained by the θ/2 method from the shape of the droplet after 2 seconds of deposition.

The evaluation results of the ink compositions of each ink example and each ink comparative example are shown in Table 2.

TABLE 2

| | Viscosity (mPa · s) | Surface tension (mN/m) | DSC Average Particle Diameter (nm) | PLQY (%) | Landing Accuracy | Contact Angle (°) |
|---|---|---|---|---|---|---|
| Example 1 | 6.9 | 32.0 | 14.1 | 95 | Pass | 16 |
| Example 2 | 6.5 | 30.5 | 15.7 | 96 | Pass | 16 |
| Example 3 | 6.8 | 30.1 | 15.2 | 94 | Pass | 15 |
| Example 4 | 7.3 | 30.2 | 15.4 | 97 | Pass | 16 |
| Example 5 | 7.5 | 30.4 | 16.3 | 98 | Pass | 16 |
| Example 6 | 5.0 | 32.3 | 16.3 | 98 | Pass | 17 |
| Example 7 | 7.3 | 30.3 | 15.3 | 97 | Pass | 16 |
| Comp. Example 1 | 6.8 | 28.6 | 13.9 | 96 | Fail | 9 |
| Comp. | 5.8 | 28.6 | >1000 | Unable to | Impossible | 8 |

TABLE 2-continued

| | Viscosity (mPa · s) | Surface tension (mN/m) | DSC Average Particle Diameter (nm) | PLQY (%) | Landing Accuracy | Contact Angle (°) |
|---|---|---|---|---|---|---|
| Example 2 | | | | measure | to test | |
| Comp. Example 3 | 4.9 | 29.1 | 16.9 | 97 | Fail | 8 |
| Comp. Example 4 | 10.5 | 28.4 | >1000 | Unable to measure | Impossible to test | 9 |

As shown by the results/data of Table 2, the quantum dot ink compositions of Example 1 to 7 each exhibit excellent dispersion stability of quantum dots, acceptable landing accuracy, and good film flatness.

On the contrary, the quantum dot ink compositions of Comparative Example 1 and Comparative Example 3 have low surface tension, and thus, they exhibit lower elasticity, and a decrease in film flatness (smaller contact angle, e.g., each less than 10°). In addition, in the ink compositions of Comparative Example 2 and Comparative Example 4, the average particle diameter of the quantum dots measured by the DLS method exceeded 1000 nm, which indicates that the quantum dots are not well dispersed, but instead, become in-part aggregated. We believe that due to this in-part aggregation, that PLQY and impact precision evaluations could not to be performed or determined.

Evaluation of Flatness of Light Emitting Layer

A sample for evaluating flatness was prepared by sequentially forming a hole injection layer "HIL for inkjet" and a hole transport layer (HTL) "poly[(9,9-dioctylfluoren-2,7-diyl)-co-(4,4'-(N-(4-sec-butylphenyl) diphenylamine)] (TFB)" in a pixel defined by fluorinated resin separator in a bank substrate. Then, the ink composition was applied onto the HTL via an ink jet process, and dried at room temperature under a reduced pressure drying for 15 minutes with an oil diffusion pump, and then heat-dried at 120° C. under a nitrogen atmosphere for 30 minutes to form a layer including the quantum dots having a thickness of 20 nm.

A micro-shape measuring instrument (ET200, Kosaka Laboratory Ltd.) was used to measure a cross-section shape of the obtained sample, and to measure an average film thickness within a width of ±40% from the center of the film. Then, 15 nm was added to the obtained average film thickness, and a width within the range of the added average film thickness was divided by a width of the bank substrate was determined as flatness.

Inks of Example 1 and Comparative Example 1 were ejected into the pixel, dried as described above, and evaluated with respect to flatness. The ink of Example 1 exhibited a flatness of 57%, and the ink of Comparative Example 1 exhibited flatness of 49%.

Figure 2:
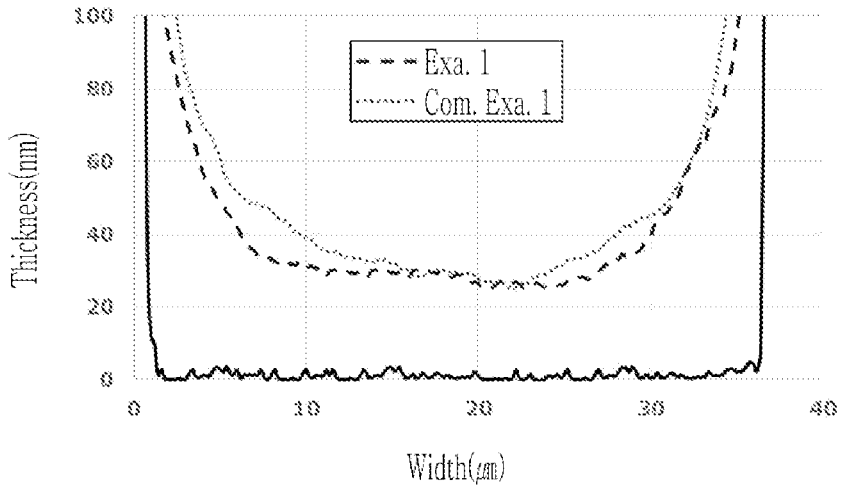
FIG. 2 is a plot showing the cross-sectional shape of a bank substrate with the deposition profiles in accordance with landing the ink of Example 1 and landing the ink of Comparative Example 1.

FIG. 2 shows profiles of the cross-sectional shapes of the bank substrate (solid line) and the ink-jet printed inks of Example 1 and Comparative Example 1. As shown in FIG. 2, because the ink of Example 1 tends to be more repulsive of a liquid the ink to a greater extent conforms to the lower corner side surfaces of the bank substrate, which results in improved flatness in comparison to the ink of Comparative Example 1. In contrast, the ink of Comparative Example 1 has a relatively low liquid repellency and is shown to follow the deposition profile of the hole transport layer, indicating a decrease in (lower) film flatness.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot ink composition comprising
a plurality of quantum dots, and
a mixed solvent comprising a Solvent a and a Solvent b,
wherein Solvent a is a cycloalkane compound with at least a ring carbon having a C11 to C16 linear alkyl group, an aromatic hydrocarbon compound with at least a ring carbon having a C8 to C12 linear alkyl group, or a combination thereof, and
Solvent b is a fluorinated alcohol.

2. The quantum dot ink composition of claim 1, wherein the quantum dot ink composition has a surface tension of greater than or equal to about 30 milliNewtons per meter and less than or equal to about 40 milliNewtons per meter.

3. The quantum dot ink composition of claim 1, wherein the Solvent a comprises n-undecyl cyclohexane, n-dodecyl cyclohexane, n-tridecyl cyclohexane, n-octyl benzene, n-nonyl benzene, n-decyl benzene, n-dodecyl benzene, or a combination thereof.

4. The quantum dot ink composition of claim 1, wherein the fluorinated alcohol is a linear, branched, or cyclic primary, secondary, or tertiary alcohol in which some or all of the hydrogen atoms are substituted with fluorine atoms.

5. The quantum dot ink composition of claim 1, wherein the fluorinated alcohol is an aliphatic primary alcohol having 6 or more carbon atoms and 12 or less carbon atoms in which some or all of the hydrogen atoms are substituted with fluorine atoms.

6. The quantum dot ink composition of claim 1, wherein the fluorinated alcohol comprises 1H, 1H,2H,2H-nonafluoro-1-hexanol, 1H,1H-tridecafluoro-1-heptanol, 1H,1H,2H,2H-tridecafluoro-1-n-octanol, 1H,1H,2H, 2H-heptadecafluoro-1-decanol, 1H,1H-tricosafluoro-1-dodecanol, or combinations thereof.

7. The quantum dot ink composition of claim 1, wherein the content of the solvent b in the mixed solvent is greater than or equal to about 0.01 parts by volume and less than or equal to about 50 parts by volume with respect to 100 parts by volume of the solvent a.

8. The quantum dot ink composition of claim 1, wherein the content of the solvent b in the mixed solvent is greater than or equal to about 0.05 parts by volume and less than or equal to about 5.0 parts by volume with respect to 100 parts by volume of the solvent a.

9. The quantum dot ink composition of claim 1, wherein an average particle diameter of the plurality of quantum dots is about 7 nanometers to about 15 nanometers.

10. The quantum dot ink composition of claim 1, wherein the plurality of quantum dots do not comprise cadmium (Cd) and lead (Pb).

11. The quantum dot ink composition of claim 1, wherein the surfaces of the plurality of quantum dots are coordinated with at least one organic ligand including a halogenated alkyl compound, a mercapto group-containing compound, or an aliphatic carboxylic acid compound.

12. The quantum dot ink composition of claim 11, wherein an amount of the at least one organic ligand coordinated to the plurality of quantum dots is about 0.5 weight percent to about 15 weight percent based on the total weight of the plurality of quantum dots and the organic ligand.

13. The quantum dot ink composition of claim 11, wherein an absolute value of a difference between a solubility parameter of the mixed solvent and a solubility parameter of the organic ligand as defined by

[(solubility parameter of the mixed solvent)–(solubility parameter of the organic ligand)] is less than or equal to about 1.5 $(cal/cm^3)^{1/2}$.

14. The quantum dot ink composition of claim 1, wherein the quantum dot ink composition has a photoluminescence quantum yield of about 90% to 100%.

15. A method of making a quantum dot electroluminescent device, the method comprising depositing the quantum dot ink composition of claim 1 via ink-jet printing to form a light emitting layer of the device, wherein the light emitting layer has a flatness of about 55% to 100%.

16. A quantum dot ink composition, comprising a plurality of dispersed quantum dots, and a mixed solvent comprising a Solvent a and a Solvent b, wherein Solvent a is a cycloalkane compound with at least a ring carbon having a C11 to C16 linear alkyl group, and Solvent b is a fluorinated alcohol, wherein the fluorinated alcohol is a linear, branched, or cyclic primary, secondary, or tertiary alcohol in which some or all of the hydrogen atoms are substituted with fluorine atoms, and the content of the solvent b in the mixed solvent is greater than or equal to about 0.05 parts by volume and less than or equal to about 3 parts by volume with respect to 100 parts by volume of the solvent a.

17. The quantum dot ink composition of claim 16, wherein the surfaces of the plurality of quantum dots are coordinated with at least one organic ligand including a halogenated alkyl compound, a mercapto group-containing compound, or an aliphatic carboxylic acid compound, and an absolute value of a difference between a solubility parameter of the mixed solvent and a solubility parameter of the organic ligand as defined by

[(solubility parameter of the mixed solvent)–(solubility parameter of the organic ligand)] is less than or equal to about 1.5 $(cal/cm^3)^{1/2}$.

18. The quantum dot ink composition of claim 16, wherein the cycloalkane compound comprises a cyclohexane compound.

* * * * *